United States Patent [19]
Wu

[11] Patent Number: 6,001,674
[45] Date of Patent: Dec. 14, 1999

[54] METHOD OF ELIMINATING BURIED CONTACT TRENCH IN SRAM DEVICES

[75] Inventor: Shye-Lin Wu, Hsinchu, Taiwan

[73] Assignee: Texas Instruments-Acer Incorporated, Hsinchu, Taiwan

[21] Appl. No.: 09/064,430

[22] Filed: Apr. 22, 1998

[51] Int. Cl.$^6$ ................. H01L 21/8232; H01L 21/8234; H01L 21/425

[52] U.S. Cl. .................... 438/142; 438/238; 438/533; 438/586; 438/597

[58] Field of Search .................................. 438/142, 238, 438/197, 586, 597, 533, 530, 305, 652, 592, FOR 351

[56] References Cited

U.S. PATENT DOCUMENTS

| | | | |
|---|---|---|---|
| 4,701,423 | 10/1987 | Szluk ........................................ | 438/231 |
| 5,082,796 | 1/1992 | El-Diwany et al. ..................... | 438/202 |
| 5,126,285 | 6/1992 | Kosa et al. .............................. | 438/533 |
| 5,162,259 | 11/1992 | Kolar et al. ............................. | 438/642 |
| 5,580,806 | 12/1996 | Chang et al. ........................... | 438/305 |
| 5,652,160 | 7/1997 | Lin et al ................................. | 438/193 |
| 5,654,231 | 8/1997 | Liang et al. ............................. | 438/533 |
| 5,700,711 | 12/1997 | Hsu et al. ................................ | 438/238 |
| 5,705,437 | 1/1998 | Wu et al. ................................. | 438/238 |
| 5,780,331 | 7/1998 | Liaw et al. .............................. | 257/393 |

OTHER PUBLICATIONS

Shye–Lin Wu et al., *Characterization of Thin Textured Tunnel Oxide Prepared by Thermal Oxidation of Thin Polysilicon Film on Silicon*, IEEE Transactions on Electron Devices, vol. 43, No. 2, Feb. 1996.

*Primary Examiner*—Michael Trinh
*Attorney, Agent, or Firm*—Harness, Dickey & Pierce, P.L.C.

[57] ABSTRACT

The method of forming buried contacts on a semiconductor substrate is as follows. At first, a gate insulator layer is formed over the substrate. A first silicon layer is then formed over. A buried contact opening is defined through the first silicon layer and the gate insulator layer extending down to the substrate. The substrate is then doped for forming a buried contact region. Next, a second silicon layer and a masking layer is formed. A shielding opening is then defined through the masking layer and the second silicon layer to a portion of the buried contact region. At the same time, an upper gate electrode and an interconnect are defined by removing a portion of the second silicon layer. A shielding layer is formed in the shielding opening over the buried contact region. A lower gate electrode is then defined by removing a portion of the first silicon layer. Following the removal of the masking layer, the substrate is doped for forming a second doping region under a region uncovered by the upper gate electrode, the interconnect, and the shielding layer. A sidewall structure is then formed on the sidewall of the upper gate electrode and the lower gate electrode. The substrate is doped for forming a third doping region in the second doping region under a region uncovered by the sidewall structure. Finally, a thermal process is performed to finish the formation of the trench-free buried contact.

19 Claims, 4 Drawing Sheets

METHOD OF ELIMINATING BURIED CONTACT TRENCH IN SRAM DEVICES

FIELD OF THE INVENTION

The present invention relates to semiconductor manufacturing processes and, more specifically, to a method of eliminating buried contact trench in SRAM (static random access memory) devices.

BACKGROUND OF THE INVENTION

From the first invention of integrated circuits in 1960, the number of devices on a chip has grown at an explosive increasing rate. The technologies of the semiconductor industry have been researched continuously for almost four decades. The progress of the semiconductor integrated circuits has stepped into the ULSI (ultra large scale integration) level or even higher level. The capacity of a single semiconductor chip has increased from several thousand devices to hundreds of millions of devices, or even to billions of devices. The integrated circuits devices like transistors, capacitors, and connections must be greatly narrowed simultaneously.

The increasing packing density of the integrated circuits generates numerous challenges to the semiconductor manufacturing process. Every device needs to be formed within a smaller size without damaging the characteristics and the operations. The demands on high packing density and low heat generation devices with good reliability and long operation life must be maintained without any degradation in their functions.

All the challenges and demands in fabrication are expected to be solved with the four key aspects of semiconductor manufacturing, including lithography, film formation, etching, and diffusion processing technologies. The continuous increase in the packing density of the integration circuits must be accompanied with a smaller feature size. In addition to chip area and functional considerations, all the devices with smaller size must be achieved with simplified and reliable manufacturing steps to raise the yield and reduce the cost of products.

In the application of memory devices, the SRAM device plays a vital role as a semiconductor storage cell in which the stored data can be latched without degradation. Typically, a SRAM cell is composed of bistable transistor flip-flops which can be implemented in various configurations. MOS (metal oxide semiconductor) transistors or bipolar transistors are used in bistable transistor flip-flops. The SRAM cell utilizes more transistors than a typical DRAM (dynamic random memory) cell which has one transistor and one capacitor. With more transistors employed in forming memory arrays, the packing density of the SRAM array is of great consideration. The packing density must be raised greatly to include more memory cells in a single chip.

The buried contact technology, which utilizes doped polycrystalline silicon or titanium nitride (TiN) layers for local interconnect, has been widely applied to the modern integrated circuits, such as SRAM and BiCMOS devices. In U.S. Pat. No. 4,701,423 to N. J. Szluk, a totally self-aligned CMOS process is disclosed. It is disclosed that the buried contacts or self-aligned buried contacts are one of the beneficial structures in improving device performance and device density. However, it is difficult to implement the buried contacts with some other beneficial structures like LDD (lightly doped drain), gate/conductor doping, and self-aligned contacts. The process complexity is increased and the device yields is hard to maintain. A CMOS process which incorporates lightly doped drain-source structures, sidewall oxide structures and self-aligned contacts is disclosed.

M. H. El-Downy et al disclose the use of a polysilicon layer for local interconnect in a CMOS or BiCMOS technology incorporating sidewall spacers in U.S. Pat. No. 5,082,796. It is addressed that the number of metal layers formed on a given portion of a wafer is limited. Therefore, the use of a polysilicon layer for local interconnect allows the metal layer that was formerly used for local interconnect to be employed as an additional global connection layer. The use of a polysilicon layer to form device contacts also results in an improvement in transistor performance through a reduction in device parasitic areas.

The buried contacts provide the electrical interconnection among gate electrodes, drain regions of the cross-coupled MOS transistors and source/drain regions of the transmission-gate transistors. However, the typical buried contacts have a major problem in the formation of the buried contact trench which interrupts the transistor current flow path causing device failure.

In U.S. Pat. No. 5,580,806 to T. T. Chang et al, a method of fabricating a buried contact structure for SRAM is disclosed. The buried contacts are used in a MOS SRAM cell, which employs two loads and two cross-coupled MOS transistors to connect each gate electrode to the drain region of the opposing cross-coupled MOS transistors. The trench formation problem in conventional application of the buried contact technology is also illustrated. The resistance is increased under the reduction of the impurity dosage.

Y. H. Wu et al. disclose a trench free process for SRAM in U.S. Pat. No. 5,705,437. The formation of an undoped region or trench is introduced to increase the electrical resistivity or leakage problem. However, the conventional processes in solving the trench formation problem generally incorporate complicated processing steps. The efforts needed in fabrication are thus increased as is the cost. What is needed is a method to form trench-free buried contacts according to a simplified process.

SUMMARY OF THE INVENTION

A method for eliminating buried contact trench in SRAM devices is disclosed in the present invention. A simpler process than the conventional buried contact process is provided.

The present invention provides a method of forming buried contacts on a semiconductor substrate. The steps according to the present invention are as follows. At first, a gate insulator layer is formed over the substrate. A first silicon layer is then formed over the gate insulator layer. A buried contact opening is defined through the first silicon layer and the gate insulator layer extending down to the substrate. The substrate is then doped with the region under the buried contact opening for forming a buried contact region. Next, a second silicon layer is formed over the substrate and the first silicon layer, and a masking layer is formed over the second silicon layer. A shielding opening is then defined through the masking layer and the second silicon layer to a portion of the buried contact region. At the same time, an upper gate electrode and an interconnect are defined by removing a portion of the second silicon layer.

A shielding layer is formed in the shielding opening over the buried contact region. A lower gate electrode is then defined by removing a portion of the first silicon layer. Following a removal of the masking layer, the substrate is doped for forming a second doping region under a region uncovered by the upper gate electrode, the interconnect, and the shielding layer. A sidewall structure is then formed on the sidewall of the upper gate electrode and the lower gate electrode. The substrate is doped for forming a third doping region in the second doping region under a region uncovered by the sidewall structure. Finally, a thermal process is performed to finish the formation of the trench-free buried contact.

In addition to the buried contact, one or more interconnecting layers can be formed. A dielectric layer is formed over the substrate after the thermal process. A metallization process can then be performed for forming connection network.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method for eliminating buried contact trench in SRAM devices is disclosed in the present invention. A more simplified process than the conventional buried contact process is provided. The packing density in forming SRAM or BiCMOS transistors can be increased with less effort according to the processing steps of the present invention.

Figure 1:
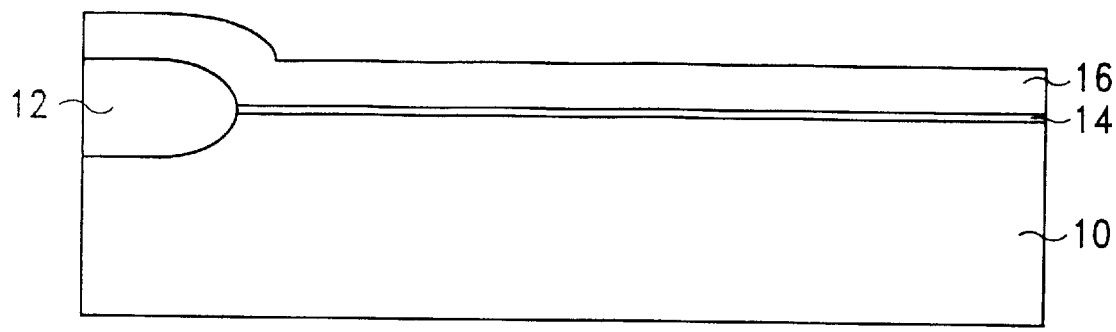
FIG. 1 illustrates a cross-sectional view of forming a gate insulator layer and a first silicon layer on a substrate in accordance with the present invention.

Referring to FIG. 1, a semiconductor substrate 10 with a preferable single crystalline silicon in a <100> direction is provided. For different applications or specifications, a substrate with different crystalline orientations or materials can be used alternatively. An isolation region using field oxide isolation 12 or other isolation technology like trench isolation (not shown) is formed on the substrate 10. A gate insulator layer 14 is formed over the substrate 10. In this case, a thin oxide layer can be used. The oxide layer 14 can be thermally grown from the substrate 10 with a thickness ranging from about 50 angstroms to 400 angstroms. A wet oxidation or a dry oxidation process can be employed to grow the oxide layer 14.

A first silicon layer 16 is then formed over the gate insulator layer 14. The first silicon layer 16 can be an undoped poly-crystalline silicon layer which is utilized as a portion of the gate electrode. The undoped poly-crystalline silicon layer 16 can be formed by chemical vapor deposition with silicon containing reactants.

Figure 2:
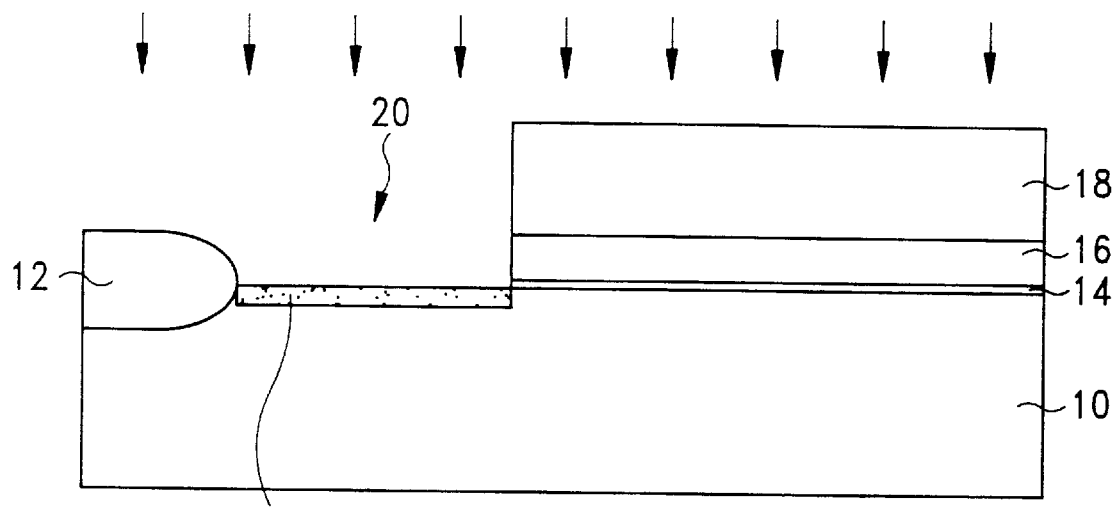
FIG. 2 illustrates a cross-sectional view of defining a buried contact opening through the first silicon layer and the gate insulator layer down to the substrate in accordance with the present invention.

Referring to FIG. 2, a buried contact opening 20 is defined through the first silicon layer 16 and the gate insulator layer 14 down to the substrate 10. The buried contact opening 20 can be defined by a patterning process which is well known in the art. A photoresist layer 18 can be formed over the first silicon layer 16. The photoresist layer 18 is then defined with the transfer of the mask pattern by a lithography process. After the photoresist layer 18 is developed, it is used as a mask in etching the first silicon layer 16 and the gate insulator layer 14. A reactive ion etching (RIE) can be performed preferably to form the buried contact opening 20.

The substrate 10 is then doped for forming a buried contact region 22 under the buried contact opening 20. An ion implantation can be performed using the photoresist layer 18 as a mask. Dopants like phosphorus-or arsenic-containing dopants can be implanted to form the n-doped buried contact region 22. The dopants can be implanted at an energy between about 10 KeV to 100 KeV to have a dose between about 5E14 to 5E16 atoms/cm$^2$.

Figure 3:
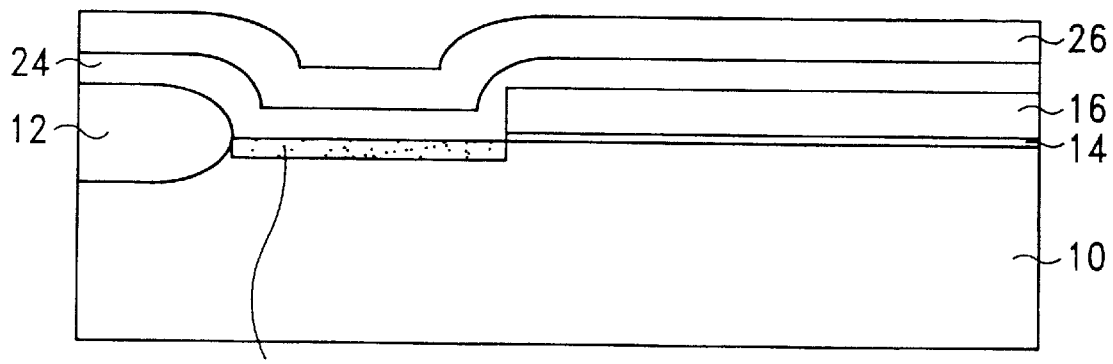
FIG. 3 illustrates a cross-sectional view of forming a second silicon layer and a masking layer in accordance with the present invention.

A second silicon layer 24 is then formed over the substrate 10 and the first silicon layer 16, as shown in FIG. 3. In this case, the second silicon layer 24 is an undoped poly-crystalline silicon layer. The undoped poly-crystalline silicon layer is also formed by chemical vapor deposition. Following the formation of the second silicon layer 24, a masking layer 26 is then formed over. A nitride layer can be used as a masking layer 26 to serve as a hard mark in the etching processes performed later. The nitride layer is formed by chemical vapor deposition.

Figure 4:
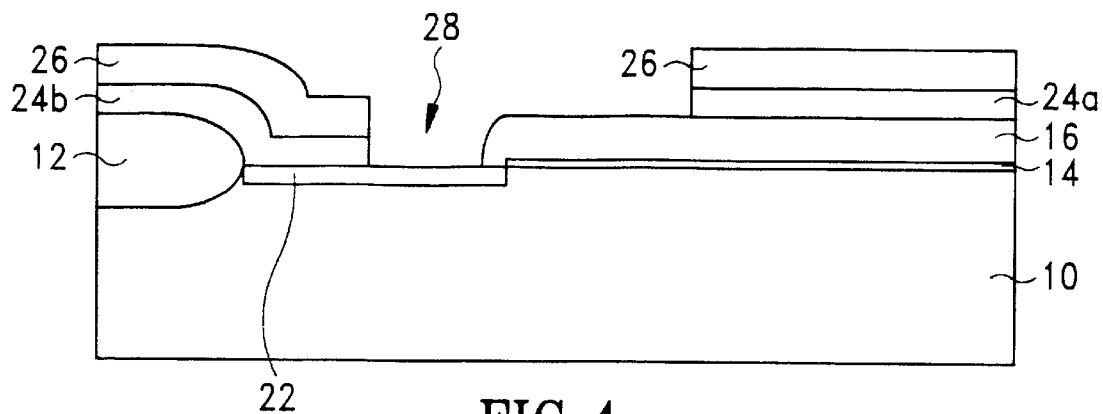
FIG. 4 illustrates a cross-sectional view of defining a shielding opening, an upper gate electrode, and an interconnect by removing a portion of the second silicon layer in accordance with the present invention.

Referring to FIG. 4, a shielding opening 28 is defined through the masking layer 26 and the second silicon layer 24, down to a portion of the buried contact region 22. An upper gate electrode 24a and an interconnect 24b are defined at the same time by removing a portion of the masking layer 26 and the second silicon layer 24. A well known patterning process can be used to define the portion to etch-off by the lithography process and the etching process.

Figure 5:
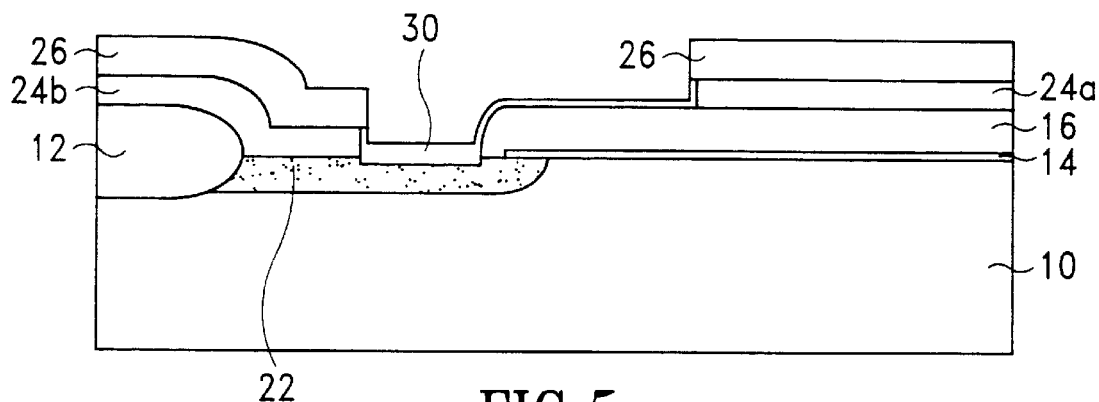
FIG. 5 illustrates a cross-sectional view of forming a shielding layer in the shielding opening over the buried contact region in accordance with the present invention.

A shielding layer 30 is formed in the shielding opening 28 over the buried contact region 22, as shown in FIG. 5. The shielding layer 30 is utilized as a mask to prevent the buried contact region 22 from etching. Thus the buried contact region 22 can be protected and the trench problem in the conventional process can be eliminated. In this case, the shielding layer 30 is formed by oxidizing an exposed portion of the substrate 10 to form an oxide layer. The oxidization can be performed with a thermal process with the presentation of oxygen, steam, or both. An oxide layer is also formed on the exposed surface of the first silicon layer 16. Since the buried contact region 22 is heavily doped, the oxidation rate of the region is much higher than the undoped first silicon layer 16. Thus, the oxide layer grown on the buried contact region 22 is found to be much thicker than that grown on the first silicon layer 16, as shown in the figure.

S. L. Wu (the inventor of the present invention) and his co-workers disclose the dependence of the oxidization rate on the implantation dose in the work "Characterization of Thin Textured Tunnel Oxide Prepared by Thermal Oxidation of Thin Polysilicon Film on Silicon" (in IEEE Transactions on Electron Devices, vol. 43, p. 287, 1996). The oxidization rate of doped substrate is found to be more than twice as fast than the undoped one, as the dose of dopants is raised to about 1E15 to 1E16 atoms/cm$^2$.

Figure 6:
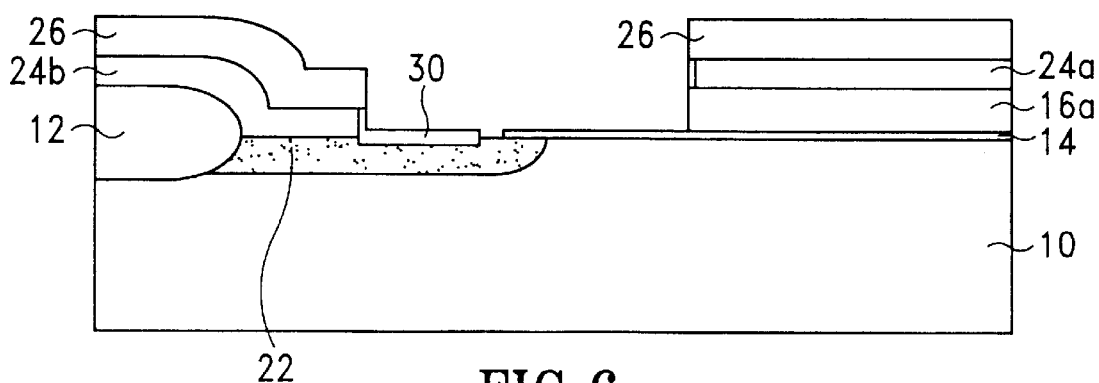
FIG. 6 illustrates a cross-sectional view of defining a lower gate electrode by removing a portion of the first silicon layer in accordance with the present invention.

Referring to FIG. 6, a lower gate electrode 16a is then defined by removing a portion of the first silicon layer 16. Using the masking layer 26 as a mask, a reactive ion etching process is performed. With the protection of the shielding layer 30, the buried contact region 22 is kept from etching and the formation of a recessed trench region can be prevented. The upper gate electrode 24a and the lower gate electrode 16a are combined as the gate electrode of a transistor.

Figure 7:
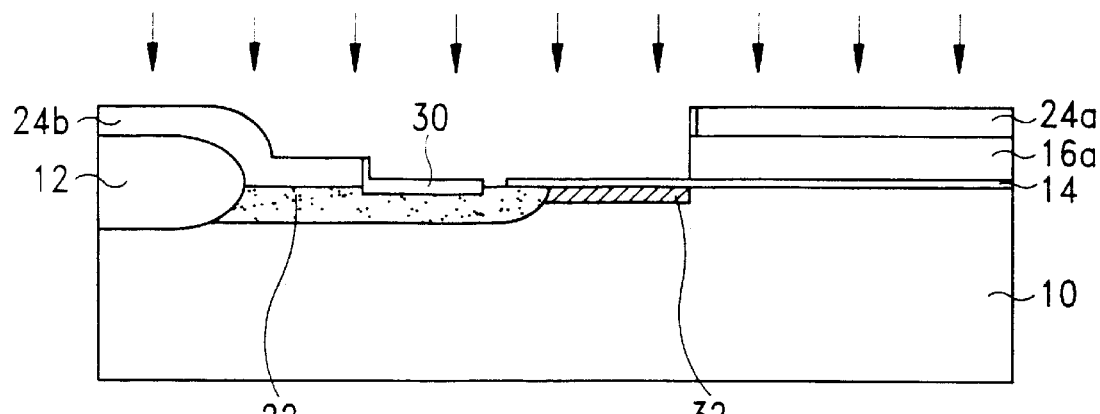
FIG. 7 illustrates a cross-sectional view of doping the substrate for forming a second doping region in accordance with the present invention.

The masking layer 26 is then removed, as shown in FIG. 7. Typically, a wet etching process with hot phosphoric acid can be performed. Next, the substrate 10 is doped for forming a second doping region 32 under a region uncovered by the upper gate electrode 24a and the interconnect 24b. The upper gate electrode 24a, the lower gate electrode 16a, and the interconnect 24b are also doped. The second doping region 32 is a lightly doped drain/source (LDD) region for a transistor structure. An ion implantation can be performed with dopants like phosphorus or arsenic containing dopants. The dopants can be implanted at an energy between about 10 KeV to 80 KeV to have a dose between about 5E12 to 5E14 atoms/cm$^2$.

Figure 8:
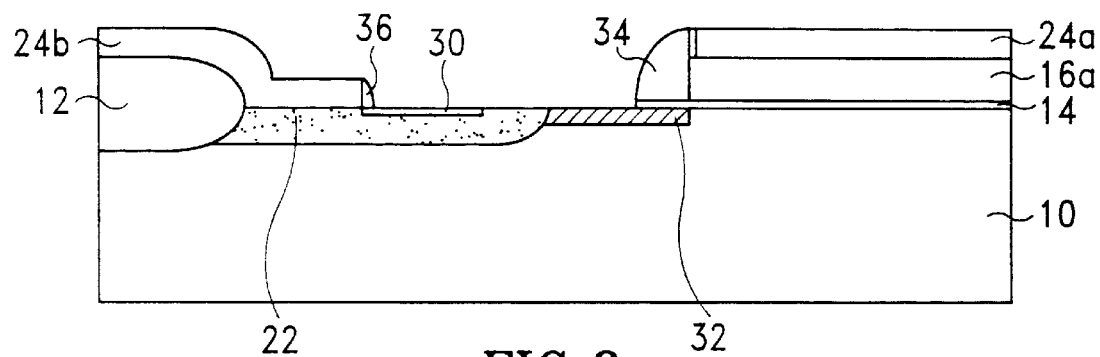
FIG. 8 illustrates a cross-sectional view of forming a sidewall structure on the sidewall of the upper gate electrode and the lower gate electrode in accordance with the present invention.

Turning to FIG. 8, a sidewall structure 34 is formed on the sidewall of the upper gate electrode 24a and the lower gate electrode 16a. The sidewall structure 34 can be oxide spacers which are formed by depositing and etching back an oxide layer. A small oxide spacer 36 may also be formed on the sidewall of the interconnect 24b at the same time.

Figure 9:
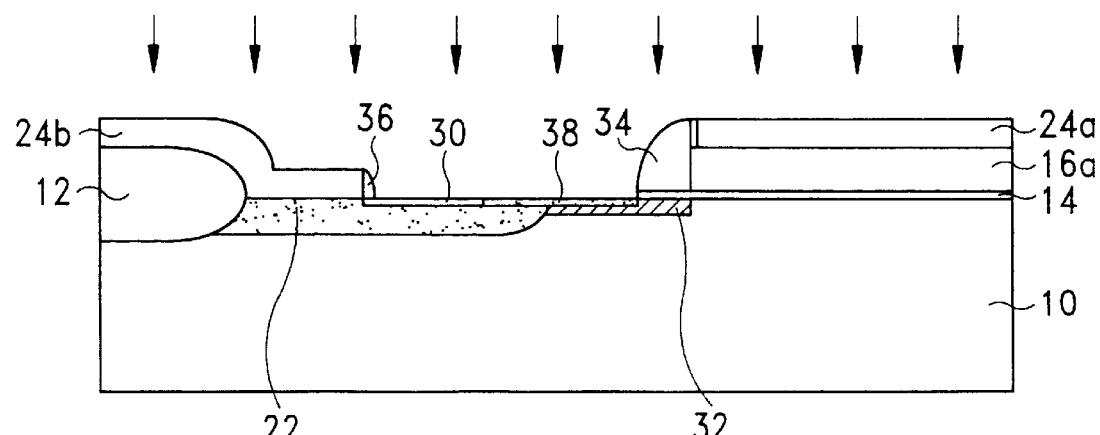
FIG. 9 illustrates a cross sectional view of doping the substrate for forming a third doping region in the second doping region in accordance with the present invention.

The substrate is then doped for forming a third doping region 38 in the second doping region 32 under a region uncovered by the sidewall structure 34, as shown in FIG. 9. The upper gate electrode 24a, the lower gate electrode 16a, and the interconnect 24b are also doped to be highly conductive. The third doping region 38 serves as a source/drain junction region with a high dose for the transistor. An ion implantation can be performed using the sidewall structure 34 as a mask. Dopants like phosphorus-or arsenic-containing dopants can be implanted to form the junction region 38. The dopants can be implanted at an energy between about 10 KeV to 100 KeV to have a dose between about 5E14 to 5E16 atoms/cm$^2$.

Figure 10:
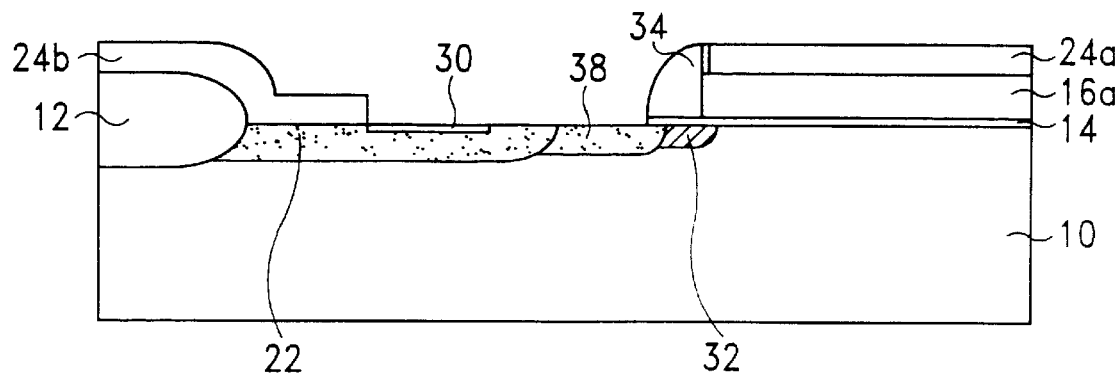
FIG. 10 illustrates a cross-sectional view of the substrate after a thermal process is performed in accordance with the present invention.

Referring to FIGURE 10, a thermal process is then performed. The dopants in the buried contact region 22, the second doping region 32, and the third doping region 38 are diffused and activated with the thermal process. In general, a rapid thermal process (RTP) can be performed. Thus the buried contact region 22 is formed and is electrically conductive with the junction region 38 without any high resistance barrier in between. The trench formation problem in the conventional process can be eliminated. A trench free buried contact is provided with benefits on conductivity and reliability.

Figure 11:
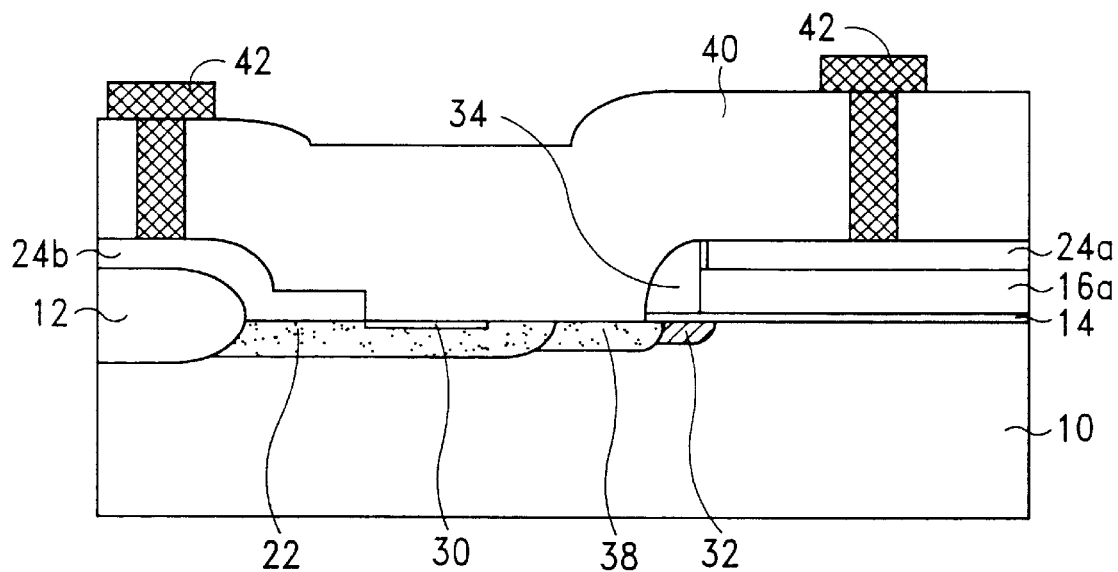
FIG. 11 illustrates a cross-sectional view of forming a connection network over the substrate in accordance with the present invention.

In addition to the local interconnections formed by buried contacts, one or more layers of global interconnections can be formed over the substrate 10. Referring to FIG. 11, a dielectric layer 40 is formed over the substrate 10 after the thermal process. In general, a chemical vapor deposited oxide layer can be utilized as the dielectric layer 40. A metallization process is then performed for forming a connection network like the conductive structure 42.

As is understood by a person skilled in the art, the foregoing descriptions of the preferred embodiment of the present invention are illustrations of the present invention rather than limitations thereon. The descriptions are intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming buried contacts on a semiconductor substrate, said method comprising the steps of:

forming a gate insulator layer over said substrate;

forming a first silicon layer over said gate insulator layer;

defining a buried contact opening through said first silicon layer and said gate insulator layer down to said substrate;

doping said substrate under said buried contact opening for forming a buried contact region;

forming a second silicon layer over said substrate and said first silicon layer;

forming a masking layer over said second silicon layer;

defining a shielding opening through said masking layer and said second silicon layer to a portion of said buried contact region and defining an upper gate electrode and an interconnect by removing a portion of said second silicon layer;

forming a shielding layer in said shielding opening over said buried contact region;

defining a lower gate electrode by removing a portion of said first silicon layer;

removing said masking layer;

doping said substrate for forming a second doping region under a region uncovered by said upper gate electrode, said interconnect, and said shielding layer;

forming a sidewall structure on the sidewall of said upper gate electrode and said lower gate electrode;

doping said substrate for forming a third doping region in said second doping region under a region uncovered by said sidewall structure; and performing a thermal process.

2. The method of claim 1 further comprising the steps of:

forming a dielectric layer over said substrate after said thermal process; and performing a metallization process for forming a connection network.

3. The method of claim 1, wherein said gate insulator layer comprises an oxide layer which is thermally grown from said semiconductor substrate.

4. The method of claim 1, wherein said first silicon layer comprises an undoped poly-crystalline silicon layer which is formed by chemical vapor deposition.

5. The method of claim 1, wherein said buried contact region is formed by ion implantation with phosphorus or arsenic containing dopants at an energy between about 10 KeV to 100 KeV to have a dose between about 5E14 to 5E16 atoms/cm$^2$.

6. The method of claim 1, wherein said second silicon layer comprises an undoped poly-crystalline silicon layer which is formed by chemical vapor deposition.

7. The method of claim 1, wherein said masking layer comprises a nitride layer which is formed by chemical vapor deposition.

8. The method of claim 1, wherein said shielding layer is formed by oxidizing said substrate to form an oxide layer.

9. The method of claim 1, wherein said second doping region is formed by ion implantation with phosphorus or arsenic containing dopants at an energy between about 10 KeV to 80 KeV to have a dose between about 5E12 to 5E14 atoms/cm$^2$.

10. The method of claim 1, wherein said sidewall structure comprises oxide spacers which are formed by depositing and etching back an oxide layer.

11. The method of claim 1, wherein said third doping region is formed by ion implantation with phosphorus or arsenic containing dopants at an energy between about 10 KeV to 100 KeV to have a dose between about 5E14 to 5E16 atoms/cm$^2$.

12. The method of claim 1, wherein said thermal process comprises a RTP process to diffuse and activate dopants in said buried contact region, said second doping region, and said third doping region.

13. A method of forming buried contacts on a semiconductor substrate, said method comprising the steps of:

forming a gate insulator layer over said substrate;

forming a first silicon layer over said gate insulator layer, said first silicon layer comprising a first undoped poly-crystalline silicon layer which is formed by chemical vapor deposition;

defining a buried contact opening through said first silicon layer and said gate insulator layer down to said substrate;

doping said substrate under said buried contact opening for forming a buried contact region;

forming a second silicon layer over said substrate and said first silicon layer, said second silicon layer comprising a second undoped poly-crystalline silicon layer which is formed by chemical vapor deposition;

forming a masking layer over said second silicon layer, said masking layer comprising a nitride layer which is formed by chemical vapor deposition;

defining a shielding opening through said masking layer and said second silicon layer to a portion of said buried contact region and defining an upper gate electrode and an interconnect by removing a portion of said second silicon layer;

forming a shielding layer in said shielding opening over said buried contact region, said shielding layer being formed by oxidizing said substrate to form a shielding oxide layer;

defining a lower gate electrode by removing a portion of said first silicon layer;

removing said masking layer;

doping said substrate for forming a second doping region under a region uncovered by said upper gate electrode, said interconnect, and said shielding layer;

forming a sidewall structure on the sidewall of said upper gate electrode and said lower gate electrode;

doping said substrate for forming a third doping region in said second doping region under a region uncovered by said sidewall structure;

performing a thermal process;

forming a dielectric layer over said substrate; and performing a metallization process for forming a connection network.

14. The method of claim 13, wherein said gate insulator layer comprises an oxide layer which is thermally grown from said semiconductor substrate.

15. The method of claim 13, wherein said buried contact region is formed by ion implantation with phosphorus or arsenic containing dopants at an energy between about 10 KeV to 100 KeV to have a dose between about 5E14 to 5E16 atoms/cm$^2$.

16. The method of claim 13, wherein said second doping region is formed by ion implantation with phosphorus or arsenic containing dopants at an energy between about 10 KeV to 80 KeV to have a dose between about 5E12 to 5E14 atoms/cm$^2$.

17. The method of claim 13, wherein said sidewall structure comprises oxide spacers which are formed by depositing and etching back an oxide layer.

18. The method of claim 13, wherein said third doping region is formed by ion implantation with phosphorus or arsenic containing dopants at an energy between about 10 KeV to 100 KeV to have a dose between about 5E14 to 5E16 atoms/cm$^2$.

19. The method of claim 13, wherein said thermal process comprises a RTP process to diffuse and activate dopants in said buried contact region, said second doping region, and said third doping region.

* * * * *